United States Patent [19]

Takanashi et al.

[11] Patent Number: 5,036,270
[45] Date of Patent: Jul. 30, 1991

[54] APPARATUS FOR DETECTING ELECTROSTATIC SURFACE POTENTIAL

[75] Inventors: Itsuo Takanashi, Kamakura; Shintaro Nakagaki, Fujisawa; Hirohiko Shinonaga; Tsutou Asakura, both of Yokohama; Masato Furuya, Yokosuka, all of Japan

[73] Assignee: Victor Company of Japan, Ltd., Japan

[21] Appl. No.: 394,040

[22] Filed: Aug. 15, 1989

[51] Int. Cl.⁵ .................... G01R 33/032; G01R 31/00
[52] U.S. Cl. .............................. 324/96; 324/158 R; 350/356; 350/403
[58] Field of Search ............... 324/96, 158 R, 457; 350/356, 374, 376, 385, 403; 356/368

[56] References Cited

U.S. PATENT DOCUMENTS

| | | | |
|---|---|---|---|
| 3,383,460 | 5/1968 | Pritchard | 350/403 |
| 3,430,048 | 2/1969 | Rubinstein | 350/403 |
| 3,719,414 | 3/1973 | Wentz | 350/385 |
| 4,841,234 | 6/1989 | Aoshima et al. | 324/96 |
| 4,866,372 | 9/1989 | Aoshima et al. | 324/96 |

FOREIGN PATENT DOCUMENTS

| | | |
|---|---|---|
| 2140439 | 8/1971 | Fed. Rep. of Germany . |
| 2953632 | 12/1984 | Fed. Rep. of Germany . |
| 3833930 | 4/1989 | Fed. Rep. of Germany . |
| 0272159 | 11/1987 | Japan .................................. 324/96 |
| 1-94270 | 12/1989 | Japan . |
| 225501 | 8/1968 | U.S.S.R. ............................ 350/403 |
| 2058386 | 4/1981 | United Kingdom . |

Primary Examiner—Ernest F. Karlsen
Attorney, Agent, or Firm—Lowe, Price, LeBlanc & Becker

[57] ABSTRACT

A set of birefringent members disposed in a path of light has an input surface via which the light enters the set and an output surface via which the light exits from the set. The birefringent members are designed and arranged so that the light separates into an ordinary ray and an extraordinary ray after the light enters the set via the input surface, that the ordinary ray and the extraordinary ray proceed along different courses respectively in the set, and that the ordinary ray and the extraordinary ray meet together where the ordinary ray and the extraordinary ray exit from the set via the output surface.

14 Claims, 1 Drawing Sheet

APPARATUS FOR DETECTING ELECTROSTATIC SURFACE POTENTIAL

BACKGROUND OF THE INVENTION

This invention relates to an apparatus for detecting an electrostatic surface potential.

The applicant previously proposed an imaging system and a recording system in which an imaging apparatus used photo-photo conversion elements to generate an optical image with a high resolution, and the optical image was recorded on a recording medium as a charge latent image by use of photo-charge conversion elements. The applicant also proposed an apparatus for detecting the distribution of an electrostatic surface potential which was used in reading out the charge latent image from the recording medium and thus generating an electric signal representative of the charge latent image.

SUMMARY OF THE INVENTION

It is an object of this invention to provide an advanced apparatus for detecting an electrostatic surface potential.

It is another object of this invention to provide an advanced sensing head usable in such an apparatus.

According to a first aspect of this invention, a sensing head comprises means for detecting an electrostatic surface potential of an object. The detecting means includes first and second birefringent members respectively including first and second uniaxial signal crystals. The first and second members have flat planar surfaces and are disposed in a path of optical energy so the flat surfaces are in confronting relation with each other and the first and second members are stacked. The first member has an input surface via which the optical energy enters the first member. The second member has an output surface via which the optical energy exists from the second member. An electric field is applied to at least one of the first and second members. The applied electric field is controlled in response to the electrostatic surface potential of the object. The birefringent members are located and arranged such that the crystal axes of the first and second members are mirror-symmetrical to each other with respect to the flat plane of the opposed birefringent members so that (i) the optical energy incident on the input surface separates into an ordinary ray and an extraordinary ray after the optical energy enters the first member via the input surface, (ii) the ordinary ray and the extraordinary ray proceed along different paths respectively in first and second members to which the electric field is applied, and (iii) the ordinary ray and the extraordinary ray meet together where the ordinary ray and the extraordinary ray exit from the second member via the output surface.

In accordance with another aspect of the invention an apparatus for detecting a charge latent image on a surface comprises a source of linearly polarized optical energy. A beam splitter is positioned to split the energy into first and second linearly polarized optical energy beams having different paths. An optical modulator is positioned in the first beam path between the beam splitter and the surface. The optical modulator is positioned and arranged to respond to the charge latent image to modulate the optical energy of the first beam to derive a third beam having polarization planes at angles determined by the charge latent image. The third beam traverses the same path as the first beam and is reflected along the same path as the second beam. An analyzer plate is positioned in the second beam path. A photoconverter responsive to optical energy traversing the analyzer plate in the second beam path derives an electric signal having an amplitude representing the charge latent image. The analyzer plate and the photoconverter cooperate to enable the angles of the polarization planes of the third beam to be determined and represented by the amplitude of the electric signal. The optical modulator comprises first and second electro-optical crystals having abutting surfaces. The first crystal has an input surface including an electrode transparent to the optical energy and at a reference potential. The second crystal has an output surface including a dielectric mirror. The output surface is positioned to be responsive to the charge latent image. The abutting, input and output surfaces are substantially at right angles to the second beam path between the splitter and the modulator. The electrical, geometric and optical properties of the crystals are such that the first beam is incident on the input surface and is split in the first crystal into ordinary and extraordinary rays. The ordinary ray propagates through the first and second crystals in the direction of the first beam path and is reflected from the output surface to the input surface along the first beam path direction. The extraordinary ray propagates through the first crystal to an interface between the crystals at an angle displaced from the first beam direction and is deflected at the interface so it: (i) propagates through the second crystal to be incident on the output surface at the same place as where the ordinary ray is incident on the output surface and (ii) is reflected from the output surface to propagate through the second crystal and then through the first crystal to be incident on the input surface at the same place where the reflected ordinary ray is incident on the first surface.

In accordance with a further aspect of the invention an apparatus for detecting a charge latent image on a surface comprises a source of linearly polarized optical energy. A beam splitter is positioned to split the energy into first and second linearly polarized optical energy beams having different paths. An optical modulator is positioned in the first beam path between the beam splitter and the surface. The optical modulator is positioned and arranged to respond to the charge latent image to modulate the optical energy of the first beam to derive a third beam having polarization planes at angles determined by the charge latent image. The third beam traverses the same path as the first beam and is reflected along the same path as the second beam. An analyzer plate is positioned in the second beam path. A photoconverter responsive to optical energy traversing the analyzer plate in the second beam path derives an electric signal having an amplitude representing the charge latent image. The analyzer plate and the photoconverter cooperate to enable the angles of the polarization planes of the third beam to be determined and represented by the amplitude of the electric signal. The optical modulator comprises first and second stacked electro-optical crystals. The first crystal has an input surface. An electrode transparent to the optical energy sandwiched between opposed adjacent surfaces of the first and second crystals is at a reference potential. The second crystal has an output surface including a dielectric mirror. The output surface is positioned to be responsive to the charge latent image. The adjacent, input and output surfaces are substantially at right angles to the second beam path between the splitter and the modulator. The electrical, geometric and optical properties of the crystals are such that the first beam is incident on the input surface and is split in the first crystal into ordinary and extraordinary rays. The ordinary ray propagates through the first and second crystals in the direction of the first beam path and is reflected from the output surface to the input surface along the first beam path direction. The extraordinary ray propagates through the first crystal to the electrode between the crystals at an angle displaced from the first beam direction and is deflected at the electrode between the crystals so it: (i) propagates through the second crystal to be incident on the output surface at the same place as where the ordinary ray is incident on the output surface and (ii) is reflected from the output surface to propagate through the second crystal and then through the first crystal to be incident on the input surface at the same place where the reflected ordinary ray is incident on the first surface.

DESCRIPTION OF THE PREFERRED EMBODIMENT

Figure 1:
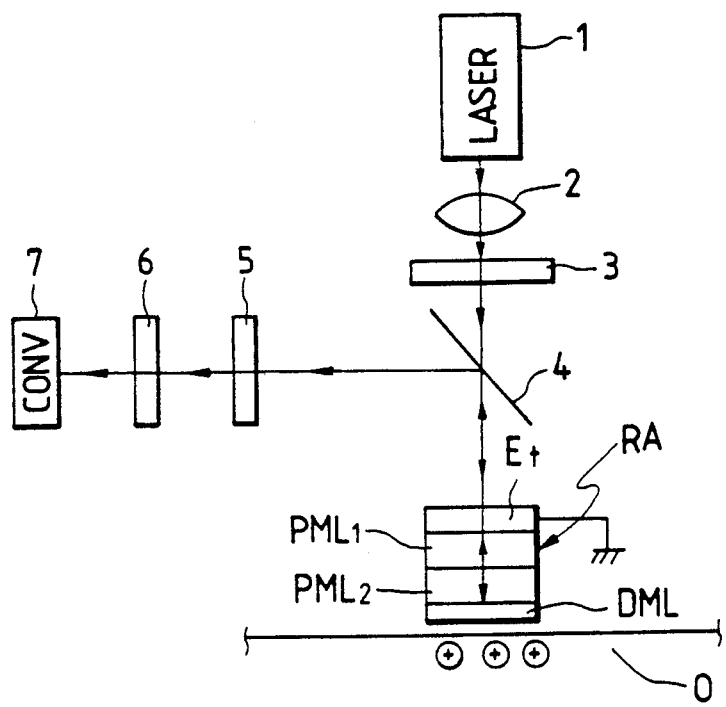
FIG. 1 is a diagram of an apparatus for detecting an electrostatic surface potential according to an embodiment of this invention.

With reference to FIG. 1, a laser 1 emits a beam of light which travels to a beam splitter 4 via a lens 2 and a polarizer 3. The lens 2 transforms the incoming light beam into a straight light beam of uniform intensity. The polarizer 3 converts the straight light beam into a linearly polarized light beam. The light beam from the polarizer 3 passes through the beam splitter 4 and then reaches a sensing head RA. The sensing head RA is closely opposed to an effective surface of an object to be measured or a recording medium O. The effective surface of the object O holds a potential having a distribution representing image information. In other words, the effective surface of the object O has a charge latent image. The sensing head RA modulates the light beam in accordance with the potential on the effective surface of the object O so that the modulated light beam carries the image information. The sensing head RA outputs the modulated light beam back to the beam splitter 4. The light beam from the sensing head RA is reflected by the beam splitter 4 toward a photoelectric converter 7 via a wave plate 5 and an analyzer 6. The wave plate 5 is used in adjusting the effective intensity of the light. The photoelectric converter 7 changes the modulated light beam to a corresponding electric signal which carries the image information.

Figure 2:
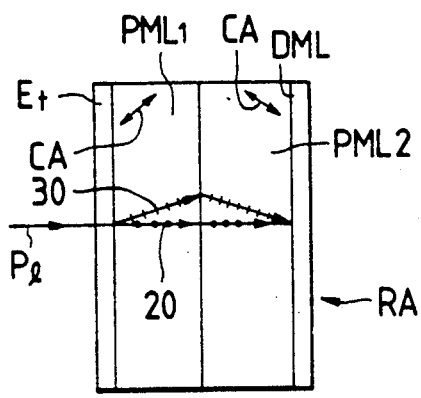
FIG. 2 is a diagram of the sensing head in FIG. 1.

As shown in FIGS. 1 and 2, the sensing head RA has a laminated structure of a transparent electrode layer Et, optical modulator layers PML1 and PML2, and a dielectric mirror layer DML. The optical modulator layers PML1 and PML2 are sandwiched between the transparent electrode layer Et and the dielectric mirror layer DML. The dielectric mirror layer DML is opposed to the measured object O while the transparent electrode layer Et is remote from the measured object O. The light beam from the beam splitter 4 enters the optical modulator layers PML1 and PML2 via the transparent electrode layer Et. The optical modulator layers PML1 and PML2 are made of material which varies the mode of light in response to an applied electric field. One example of the material for the optical modulator layers PML1 and PML2 PML is a single crystal of lithium niobate which has the electrooptic effect.

As described previously, the light beam from the beam splitter 4 enters the optical modulator layers PML1 and PML2 of the sensing head RA via the transparent electrode layer Et. The light beam passes through the optical modulator layers PML1 and PML2 and reaches the dielectric mirror layer DML. Then, the light beam is reflected by the dielectric mirror layer DML and returns to the beam splitter 4 via the optical modulator layers PML1 and PML2 and the electrode layer Et.

The optical modulator layers PML1 and PML2 of the sensing head RA are subjected via the dielectric mirror layer DML to the electric field which depends on the charge latent image formed on the object O. The transparent electrode layer Et is grounded to enable the exposure of the optical modulator layers PML1 and PML2 to the image-representing electric field. Therefore, the mode of the light beam passing through the optical modulator layers PML1 and PML2 varies with the electric field so that the light beam carries information related to the charge latent image. Specifically, the mode i.e. the angle of the polarization plane of the light beam varies with the potential distribution of the charge latent image. The analyzer 6 enables the photoelectric converter 7 to sense the angle of the polarization plane of the light beam as it is converted to an amplitude modulated electrical signal.

The optical modulator layers PML1 and PML2 are made of same birefringent uniaxial single crystals and have same thicknesses. The optical modulator layers PML1 and PML2 are located in a manner such that the crystal axes CA of the respective optical modulator layers PML1 and PML2 are mirror-symmetrical to each other with respect to the plane of the boundary between the optical modulator layers PML1 and PML2.

As shown in FIG. 2, when the incoming light $P_I$ enters the optical modulator layer PML1 via the transparent electrode layer Et, the light separates into an ordinary ray 20 and an extraordinary ray 30 travelling away from each other. The ordinary ray 20 travels in the same direction as the direction of the path of the incoming light $P_I$ while the extraordinary ray 30 deviates from the direction of the path of the incoming light $P_I$. After the ordinary ray 20 and the extraordinary ray 30 pass through the optical modulator layer PML1, they enter the optical modulator layer PML2. When the ordinary ray 20 and the extraordinary ray 30 enter the optical modulator layer PML2, the ordinary ray 20 advances without changing its direction but the extraordinary ray 30 changes in its travel direction and proceeds toward the course of the ordinary ray 20. After the ordinary ray 20 and the extraordinary ray 30 pass through the optical modulator layer PML2, they reach the dielectric mirror layer DML. At the surface of the dielectric mirror layer DML, the ordinary ray 20 and the extraordinary ray 30 meet each other and are reflected together by the dielectric mirror layer DML and travel back through the optical modulator layers PM_L1 and PML2 retracing respectively their incoming light paths to the dielectric mirror layer DML.

In this way, the birefringences of the optical modulator layers PML1 and PML2 cancel each other for the path of the incoming light $P_I$ thus a landing of the incoming light $P_I$ to the dielectric mirror layer DML is accurately performed as a single point. This assures a high resolution pickup of the charge latent image. On the contrary, in case of conventional sensing head where only one optical modulator layer of a birefringent single crystal is used, the birefringence of the single optical modulator layer causes an offset between the ordinary ray and the extraordinary ray at their landing positions on the dielectric mirror layer and decreases the resolution of the picked up image.

A suitable scanning device (not shown) moves the light beam relative to the charge latent image on the object O so that the charge latent image can be scanned.

The sensing head RA may have three or more optical modulator layers as long as the following condition is satisfied. Separated ordinary and extraordinary rays meet together at the surface of the dielectric mirror layer DML.

Figure 3:
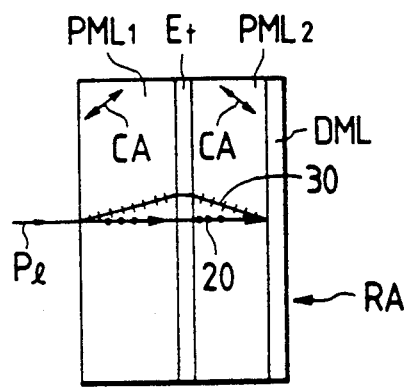
FIG. 3 is a diagram of a modified sensing head.

FIG. 3 shows a modified sensing head RA in which a transparent electrode layer Et extends between optical modulator layers PML1 and PML2. In other points, the sensing head of FIG. 3 is similar to the sensing head of FIG. 2.

It should be noted that the light beam referred to in the foregoing may be any of electromagnetic energy beams including radio wave, alpha ray, X-ray and other radio active energy rays.

What is claimed is:

1. A sensing head comprising:
   (a) means for detecting an electrostatic surface potential of an object, the detecting means comprising:
      (a1) first and second birefringent members respectively including first and second uniaxial signal crystals, the first and second members having flat planar surfaces, the first and second members being disposed in a path of optical energy so the flat planes are in confronting relation with each other so that the first and second members are stacked with respect to the plane, the first member having an input surface via which the optical energy enters the first member, the second member having an output surface via which the optical energy exits from the second member; and
      (a2) electric field formation means for applying an electric field to at least one of the first and second members, the applied electric field being controlled in response to the electrostatic surface potential of the object;
   the birefringent members being located and arranged such that the crystal axes of the first and second members are mirror-symmetrical to each other with respect to the flat plane of the opposed birefringent member so that (i) the optical energy incident on the input surface separates into an ordinary ray and an extraordinary ray after the optical energy enters the first member via the input surface, and (ii) the ordinary ray and the extraordinary ray proceed along different paths respectively in first and second members to which the electric field is applied, and (iii) the ordinary ray and the extraordinary ray meet together where the ordinary ray and the extraordinary ray exit from the second member via the output surface.

2. The sensing head of claim 1 wherein the detecting means further comprises a dielectric mirror extending adjacent the output surface of the second member.

3. The sensing head of claim 1 wherein the birefringent members are stacked together so the first and second members have abutting faces at the flat plane.

4. The sensing head of claim 1 wherein the electric field formation means comprises a transparent electrode adjacent the input surface of the first member so the electric field is applied to both of said members.

5. The sensing head of claim 1 wherein the electric field formation means comprises a transparent electrode sandwiched between the flat planes so the electric field is applied only to said second member.

6. The sensing head of claim 1 wherein each of the crystals has the same thickness.

7. Apparatus for detecting a charge latent image on a surface comprising a source of a linearly polarized optical energy,
   a beam splitter positioned to split the energy into first and second linearly polarized optical energy beams having different paths,
   an optical modulator positioned in the first beam path between the beam splitter and the surface, the optical modulator being positioned and arranged to respond to the charge latent image to modulate the optical energy of the first beam to derive a third beam having polarization planes at angles determined by the charge latent image, the third beam traversing the same path as the first beam and being reflected along the same path as the second beam,
   an analyzer plate positioned in the second beam path,
   a photoconverter responsive to optical energy traversing the analyzer plate in the second beam path for deriving an electric signal having an amplitude representing the charge latent image, the analyzer plate and the photoconverter cooperating to enable the angles of the polarization planes of the third beam to be determined and represented by the amplitude of the electric signal,
   the optical modulator comprising:
   first and second electro-optical crystals having abutting surfaces, the first crystal having an input surface including an electrode transparent to the optical energy, said electrode being at a reference potential, the second crystal having an output surface including a dielectric mirror, the output surface being positioned to be responsive to the charge latent image, said abutting, input and output surfaces being substantially at right angles to the second beam path between the splitter and the modulator; the electrical, geometric and optical properties of the crystals being such that the first beam is incident on the input surface and is split in the first crystal into ordinary and extraordinary rays, the ordinary ray propagating through said first and second crystals in the direction of the first beam path and being reflected from the output surface to the input surface along the first beam path direction, the extraordinary ray propagating through said first crystal to an interface between the crystals at an angle displaced from the first beam direction and being deflected at the interface so it: (i) propagates through the second crystal to be incident on the output surface at the same place as where the ordinary ray is incident on the output surface and (ii) is reflected from the output surface to propagate through the second crystal and then through the first crystal to be incident on the input surface at the same place where the reflected ordinary ray is incident on the first surface.

8. The apparatus of claim 7 wherein each of the crystals has the same birefringement and is a single crystal having a single axis having the axis of the crystals being mirror-symmetrical with respect of the interface between the crystals.

9. The apparatus of claim 8 wherein each of the crystals has the same thickness.

10. The apparatus of claim 7 wherein each of the crystals has the same thickness.

11. Apparatus for detecting a charge latent image on a surface comprising a source of a linearly polarized optical energy,
a beam splitter positioned to split the energy into, first and second linearly polarized optical energy beams having different paths,
an optical modulator positioned in the first beam path between the beam splitter and the surface, the optical modulator being positioned and arranged to respond to the charge latent image to modulate the optical energy of the first beam to derive a third beam having polarization planes at angles determined by the charge latent image, the third beam traversing the same path as the first beam and being reflected along the same path as the second beam,
an analyzer plate positioned in the second beam path,
a photoconverter responsive to optical energy traversing the analyzer plate in the second beam path for deriving an electric signal having an amplitude representing the charge latent image, the analyzer plate and the photoconverter cooperating to enable the angles of the polarization planes of the third beam to be determined and represented by the amplitude of the electric signal,
the optical modulator comprising:
first and second stacked electro-optical crystals, the first crystal having an input surface, an electrode transparent to the optical energy sandwiched between opposed adjacent surfaces of the first and second crystals, said electrode being at a reference potential, the second crystal having an output surface including a dielectric mirror, the output surface being positioned to be responsive to the charge latent image, said adjacent, input and output surfaces being substantially at right angles to the second beam path between the splitter and the modulator; the electrical, geometric and optical properties of the crystals being such that the first beam is incident on the input surface and is split in the first crystal into ordinary and extraordinary rays, the ordinary ray propagating through said first and second crystals in the direction of the first beam path and being reflected from the output surface to the input surface along the first beam path direction, the extraordinary ray propagating through said first crystal to the electrode between the crystals at an angle displaced from the first beam direction and being deflected at the electrode between the crystals so it: (i) propagates through the second crystal to be incident on the output surface at the same place as where the ordinary ray is incident on the output surface and (ii) is reflected from the output surface to propagate through the second crystal and then through the first crystal to be incident on the input surface at the same place where the reflected ordinary ray is incident on the first surface.

12. The apparatus of claim 11 wherein each of the crystals has the same birefringement and is a single crystal, having a single axis, the axis of the crystals being mirror-symmetrical with respect of the electrode between the crystals.

13. The apparatus of claim 12 wherein each of the crystals has the same thickness.

14. The apparatus of claim 11 wherein each of the crystals has the same thickness.

* * * * *